United States Patent [19]

Harrah et al.

[11] Patent Number: 4,588,801

[45] Date of Patent: May 13, 1986

[54] POLYSILANE POSITIVE PHOTORESIST MATERIALS AND METHODS FOR THEIR USE

[75] Inventors: Larry A. Harrah; John M. Zeigler, both of Albuquerque, N. Mex.

[73] Assignee: The United States of America as represented by the United States Department of Energy, Washington, D.C.

[21] Appl. No.: 597,005

[22] Filed: Apr. 5, 1984

[51] Int. Cl.$^4$ .............................................. C08G 77/04
[52] U.S. Cl. ...................................... 528/33; 528/25; 528/30; 556/430; 430/326
[58] Field of Search .................... 556/430; 528/25, 30, 528/33

[56] References Cited

U.S. PATENT DOCUMENTS

| | | | |
|---|---|---|---|
| 2,554,976 | 5/1951 | Burkhard | 556/430 |
| 2,606,879 | 8/1952 | Clark | 556/430 |
| 2,612,511 | 9/1952 | Orkin | 556/430 |
| 4,052,430 | 10/1977 | Yajima et al. | 556/430 |
| 4,276,424 | 6/1981 | Peterson et al. | 556/430 |
| 4,324,901 | 4/1982 | West et al. | 556/430 |
| 4,377,677 | 3/1983 | Iwai et al. | 528/33 |
| 4,464,460 | 8/1984 | Hiraoka et al. | 430/323 |

FOREIGN PATENT DOCUMENTS 1236506 3/1967 Fed. Rep. of Germany ...... 556/430

OTHER PUBLICATIONS

IBM Technical Disclosure Bulletin, vol. 26, No. 10B, Mar. 1984, Silane Polymer Eximer Laser Photoresist.
West et al., JACS, 103, pp. 7352-7354 (1981).
Ishikawa et al., J. Organometal. Chem.; 42, 333-338, (1972).
Wesson et al., J. Poly. Sci., Chem. Ed., 17, 2833-2843, (1979).
Wesson et al., J. Poly. Sci., Chem. Ed., 18, 959-965 (1980).
Wesson et al., J. Poly. Sci., Chem. Ed., 19, 65-72 (1981).
Trefonas et al., J. Poly. Sci., Polymer Letters Ed., 21, 819-829 (1983).
Xing-Hua Zhang et al., J. Poly. Sci., Poly. Chem. Ed., 22, 159-170 and 225-238 (1984).

*Primary Examiner*—Melvyn I. Marquis
*Attorney, Agent, or Firm*—Armand McMillan; Albert Sopp; Judson R. Hightower

[57] ABSTRACT

New polysilane copolymers comprise recurring units of —Si(X)(Y)— and Si(A)(B)—, Si(X)(Y) being different from Si(A)(B), wherein
  X and Y together have 1-13 carbon atoms, and X and Y each independently is hydrogen, alkyl, cycloalkyl, phenyl, alkylphenyl, or phenylalkyl, with the proviso that only one of X and Y contains a phenyl moiety, or together X and Y are an alkylene group forming a ring with the adjoining Si atom, and wherein
  A and B together have 3-13 carbon atoms, and A and B each independently is alkyl or cycloalkyl, with the proviso (a) that when one of A and B is ethyl, the other is not methyl or ethyl, and (b) that when one of A and B is n-propyl and the other is methyl, X and Y are not both methyl.

Corresponding homopolysilanes are also provided.

Upon ultraviolet irradiation, they photodepolymerize to form volatile products. As a result, they represent a new class of photoresists which enable direct formation of a positive image eliminating the heretofore required development step.

18 Claims, No Drawings

POLYSILANE POSITIVE PHOTORESIST MATERIALS AND METHODS FOR THEIR USE

The U.S. Government has rights in this invention pursuant to Contract No. DE-AC04-76DP00789 between the U.S. Department of Energy and AT&T Technologies, Inc.

BACKGROUND OF THE INVENTION

This invention relates to new photoresist materials which can be used to directly achieve a positive image of a desired pattern on a substrate and to methods for their us which eliminate the conventional developing step.

Printed circuit boards, ubiquitous components of modern electronic equipment, are manufactured by the millions using photoresists. Typically, the photoresist is a thin layer of a photoreactive monomer which polymerizes on exposure to light, changing from a soluble to an insoluble form. Like a photographic plate, the image is a negative one developed by solvent removal of the unexposed areas. This development step contributes a significant amount to the overall cost of printed circuit production. Its elimination could, therefore, reduce costs by a considerable amount.

Heretofore, the polysilane class of polymers has not been applied in photoresist technology. However, polysilanes are known. For example, West et al, J.A.C.S. 103, 7352 (1981) discloses (phenylmethyl-codimethyl) silane as a solid film which crosslinks under UV irradiation. Ishikawa et al, J. Organometallic Chem., 42, 333 (1972) discloses the preparation of permethylpolysilanes which degrade to non-volatile octamethyltrisilane and other polymeric materials upon exposure to UV irradiation in solution. Wesson et al, J. Poly. Sci., Polym. Chem. Ed., 7, 2833 (1979) discloses the preparation of polydimethylsilane. Wesson et al, op. cit., 19, 65 (1981) discloses block copolymers of ethylmethyl- and dimethyl-silane units. Wesson et al, op. cit., 18, 959 (1980) discloses the preparation of copolymers of ethylmethylsilane units with dimethylsilane units as well as of methyl/propyl units with dimethyl units. In addition, U.S. Pat. Nos. 2,544,976, 4,052,430, 2,612,511 and 4,276,424 disclose preparation of other silane-type photoresists.

There remains a need to provide photoresists which are simpler and easier to use and which have the properties desirable in the photopatterning process used, e.g., in the microelectronics industry. At the same time, it is desirable to extend the range of uses of the polysilanes into this area.

SUMMARY OF THE INVENTION

Accordingly, it is an object of this invention to provide new photoresist materials which can be used directly to form a positive image of a desired pattern on the surface of a substrate.

It is another object of this invention to provide such positive photoresist materials which are based on polysilanes.

It is also another object of this invention to provide such polysilanes and new uses therefor.

Upon further study of the specification and appended claims, further objects and advantages of this invention will become apparent to those skilled in the art.

These objects have been attained by providing polysilanes comprising recurring units of —Si(X)(Y)— wherein

X and Y together have 4-13 carbon atoms,
and
X and Y each independently is hydrogen, alkyl, cycloalkyl or phenylalkyl, or together X and Y are an alkylene group forming a ring with the adjoining Si atom, with the proviso that only one of X and Y contains a phenylalkyl group.

These objects have also been attained by providing polysilane copolymers comprising recurring units of —Si(X)(Y)—and —Si(A)(B)—, Si(X)(Y) being different from Si(A)(B), wherein X and Y together have 1-13 carbon atoms,
and
X and Y each independently is hydrogen, alkyl, cycloalkyl, phenyl, alkylphenyl, or phenylalkyl, with the proviso that only one of X and Y contains a phenyl moiety, or together X and Y are an alkylene group forming a ring with the adjoining Si atom,
and wherein
A and B together have 3-13 carbon atoms,
and
A and B each independently is alkyl or cycloalkyl, with the proviso (a) that when one of A and B is ethyl, the other is not methyl or ethyl, and (b) that when one of A and B is n-propyl and the other is methyl, X and Y are not both methyl.

These objects have further been attained by providing a photofabrication method wherein X and Y each is methyl, and one of A and B is methyl and the other is cyclohexyl, n-hexyl or n-dodecyl; or wherein one of X and Y is methyl and the other is n-propyl, and one of A and B is methyl and the other is isopropyl.

These objects have been provided, in preferred aspects by providing homopolysilanes wherein X and Y each is methyl, ethyl, phenethyl, isopropyl, n-propyl, t-butyl, n-hexyl, or n-dodecyl, or X and Y together form a pentamethylene group; by providing polysilane copolymers wherein X and Y each is methyl, ethyl, or propyl, or X and Y together form pentamethylene; and wherein one of A and B is n-propyl, isopropyl, t-butyl, cyclohexyl, n-hexyl, or n-dodecyl and the other is methyl or ethyl; by providing polysilane copolymers wherein X and Y each is methyl, and one of A and B is cyclohexyl, n-hexyl or n-dodecyl; or wherein one of X and Y is methyl and the other is n-propyl, and one of A and B is methyl and the other is isopropyl; and by providing such polysilanes and a corresponding photopatterning method whereby a high resolution of 1-4 μm or higher is provided during the photoresist processing.

These objects have further been achieved by providing a corresponding process comprising coating a substrate, photopatterning it and removing the coating from the substrate in a photoresist-type process; they have further been attained by providing compositions comprising the mentioned photoresist polysilanes along with other conventional ingredients used in photoresist processing, and also by providing the products of such processes as well as the combination of substrates, typically microelectronic substrates, and polysilane coatings.

DETAILED DISCUSSION

All of the polysilane polymers of this invention are useful for several purposes. For example, these polysilanes can be formulated with conventional, usually commercially available, crosslinking agents. Such agents can be coated onto surfaces, articles, etc. to provide protective layers. Furthermore, the polysilanes are useful in processes involving photopatterning, e.g., in conventional photolithography and photoresist applications. These include the patterning of decorative features on a wide variety of substrates, low resolution patterning of preselected designs on such substrates and high resolution patterning of highly complex patterns thereon, e.g., those required in the microelectronics industry. A major advantage of this invention for all such uses is that the desired pattern is produced in a positive image as will be explained more fully below. This eliminates the costly and time consuming development step required in the prior art photopatterning techniques. The high resolution photopatterning processes are preferred in this invention; consequently, the following discussion will be framed primarily in terms appropriate for this use. However, this is not intended to limit the scope of this invention or to exclude the other uses of the polysilanes.

In general, for high resolution applications, the polysilane will have a high photosensitivity under actinic radiation resulting in photodepolymerization of the irradiated areas. The products of the photodepolymerization step must be sufficiently volatile at the polysilane temperature so that the products vaporize, thereby exposing the underlying substrate. In addition, the polysilane must be formable into a film and must have a low crystallinity in film form. Otherwise, there will be significant light scattering effects which will degrade resolution. Of course, the polysilane structure must be of a nature that the film does not crosslink under actinic radiation, preferably ultraviolet radiation. Various combinations of substituents on the silicon-atom backbone of a polysilane molecule are effective to achieve these properties to varying degrees. Suitable polymers for any of the foregoing uses and having a desired combination of properties can be conventionally prepared, perhaps with a few routine preliminary experiments using the guidelines discussed herein.

Polysilane homopolymers will have two substituents on each silicon atom, denoted as X and Y. Preferably, these substituents together will have 4–13 carbon atoms. Combinations of X and Y substituents having fewer than 4 carbon atoms in total tend to be highly crystalline and are not satisfactory for use in high resolution processes. However, these are included within the scope of this invention in methods which do not demand high resolution. For example, they can be successfully used in very low resolution processes such as those wherein decorative effects are to be achieved on substrates. Light scattering due to a high crystallinity of a polymer can even be of advantage in such applications, e.g., in view of the interesting effects which can be produced thereby. Polysilanes wherein X and Y in combination have a total number of carbon atoms greater than 13 are also within the scope of this invention. However, such homopolymers will depolymerize to form relatively heavy fragments requiring relatively high temperatures for volatilization. Applications wherein such high temperatures can be used, however, are within the scope of this invention; consequently, the corresponding polysilanes which decompose into fragments which volatilize only at such high temperatures, e.g., on the order of 200° C. or higher, are contemplated as equivalents within the scope of this invention. Similarly, also within the scope of this invention are other substituents X and Y which are not based upon hydrocarbon moieties, especially those bonded to Si atoms via C-atoms.

Typically, the substituents X and Y will be selected independently among hydrogen, alkyl, cycloalkyl or phenylalkyl groups. Together, X and Y can also form alkylene groups linking with the connecting silicon atom to form a ring. Polysilanes wherein neither X nor Y is hydrogen are preferred. Hydrogen atoms on the polymer chain cause a high tendency toward reaction with oxygen making the polymers very difficult to handle. However, where such constraints are not a problem, hydrogen substituents are employable.

Suitable alkyl groups have 1–12 carbon atoms, e.g., include methyl, ethyl, n-propyl, isopropyl, n-butyl, sec-butyl, isobutyl, t-butyl, n-pentyl and its isomers, n-hexyl and its isomers, n-heptyl and its isomers, n-octyl and its isomers, n-nonyl and its isomers, n-decyl and its isomers, n-undecyl and its isomers, and n-dodecyl and its isomers. Similarly, suitable cycloalkyl groups have 3–12 carbon atoms and include all of the various possibilities derived from the corresponding alkyl groups, e.g., those mentioned above, including those cycloalkyl groups having alkyl substituents. Preferably, the cycloalkyl group is cyclopentyl, cyclohexyl, cycloheptyl, etc., most preferably cyclohexyl. Suitable phenylalkyl groups are those based on the mentioned alkyl groups, e.g., the $C_{1-6}$-alkyl groups. The alkylene groups formed by X and Y together also encompass all of the various possibilities derived from the corresponding alkyl groups mentioned above, i.e., are of 2–12 carbon atoms, including those having alkyl substituents. As can be seen, the Si atoms can be bonded to primary, secondary or tertiary C-atoms.

The foregoing discussion of suitable groups is not meant to be precisely limiting on the number of carbon atoms possible. As discussed above, under appropriate circumstances and for suitable uses, moieties having a greater number of carbon atoms will be suitable and, consequently, are contemplated as equivalents within the scope of this invention.

The substituents X and Y are selected to provide the proper balance, at the polysilane temperature during irradiation, between photosensitivity to actinic radiation and volatility of the fragments which result from the photodepolymerization. That is, the substituents X and Y must be of sufficient bulkiness to provide significant steric hindrance which, it is believed, contributes toward destabilization of the polysilane. However, they must also be sufficiently lightweight to produce sufficiently small fragments to be volatile at the instantaneous local temperature of the polymer during the irradiation period. As mentioned, selection of appropriate substituents for the intended end use can be achieved easily, perhaps with a few routine preliminary experiments, in accordance with this discussion.

For example, cyclohexyl-methyl homopolysilane has good photosensitivity toward depolymerization due to the presence of the cyclohexyl group. It undergoes only low ablation at room temperature but at elevated temperatures has good ablation properties. Homodi-n-hexyl polysilane undergoes photodecomposition but does not ablate well at room temperature; however, at elevated temperatures its ablation is increased, whereby good photopatterning can be achieved. The polymer does have considerable crystallinity which limits resolution. The properties of homomethyl-n-dodecyl polysilane are very similar to those described for the di-n-hexyl homopolymer. Homomethylphenethyl polisilane does undergo photodepolymerization and will ablate at temperatures above room temperature.

Homopolymers based on X and Y moieties which are methyl and/or ethyl in each case tend to be highly crystalline, again limiting the achievable resolution. In addition since these substituents are relatively small, photosensitivity is not high. However, each of these polymers can be employed in one of the uses which places low demands on resolution, volatility, speed, etc. Some of these homopolymers which have been made include those wherein X and Y are both methyl (highly insoluble) and wherein one is methyl and the other is ethyl. Crystallinity is also observed for homopolymer films wherein one of X and Y is methyl and the other is isopropyl (much less crystalline than the dimethyl homopolymer). Homopolymers containing Si-aryl moieties tend to be too photoinsensitive to provide sufficient depolymerization under the influence of ultraviolet radiation, presumably because of regularities in the alignment of the pendant phenyl groups, i.e., due to low steric hindrance effects. For instance, homomethylphenylpolysilane is very photoinsensitive in the solid state throughout the ultraviolet region.

The foregoing discussion of typical homopolymers demonstrates the nature of size effects on both photosensitivity and volatility. Further guidance in selecting an appropriate homo- or co-polysilane for a given use can be obtained from routine studies of a polysilane's photosensitivity in solution. However, there is no direct correlation with the photosensitivity of a corresponding film.

In various preferred aspects, the homopolymers of this invention have X and Y moieties which together have at least 5, 6, 7 or 8 carbon atoms and also which have a maximum of 12, 11, 10, or 9 carbon atoms. In general, it is preferred that each of X and Y be selected among methyl, ethyl, phenethyl, isopropyl, n-propyl, t-butyl, n-hexyl and n-dodecyl.

It is preferred that the polysilane used in this invention be a copolymer of recurring units (—Si(X)(Y)—Si(A)(B)—)$_n$. In this way, one set of units can be selected to appropriately tailor the photosensitivity of the polysilane towards photodepolymerization and the other can be used to appropriately tailor the volatility of the fragments which result. That is, one unit will be selected to be sufficiently bulky to provide sufficient steric hindrance that the polysilane photodepolymerizes, while the other will be selected to be sufficiently lightweight that the resultant fragments volatilize at the temperature of the polysilane during actinic irradiation. Moreover, the copolymers are preferred because they have a lower tendency toward crystallinity.

In general, the entire discussion above regarding the structure of the homopolymers applies to the copolymers unless indicated otherwise.

In the following description of suitable polysilane copolymers, the moieties X and Y are used to define the volatile component. Preferably, this component is one in which both X and Y are methyl. The suitability of employing dimethyl units will, of course, depend upon the nature of the A/B units used. The smaller the size of the substituents in the volatile unit, the greater is the tendency toward crystallization. This tendency will be exacerbated when the A/B moieties are also relatively small in size. However, in general, the volatile units can have X and Y moieties of a total number of carbon atoms in the range of 1-13. Even larger moieties can be employed under appropriate conditions as indicated above, primarily when high polysilane temperatures are achieved during irradiation and/or when the A/B unit is of relatively small size. Consequently, X/Y moieties having a total number of carbon atoms greater than 13 are contemplated equivalents within the scope of this invention.

As mentioned above, it is preferred that neither X nor Y be hydrogen. Suitable alkyl and cycloalkyl moieties include those mentioned above. These include the alkyl portions of the alkylphenyl and phenylalkyl moieties as long as the carbon atom limitations are observed. The same alkylene groups formed by X and Y together in the homopolymers are employable in the copolymers.

The unit denoted as having A and B substituents is the photosensitivity contributor. Again, the stated total carbon atom range of 3–13 is generally appropriate. However, under some circumstances moieties having fewer than 3 or greater than 13 carbon atoms could be successfully employed; consequently, they are contemplated as equivalents within the scope of this invention. Suitable alkyl and cycloalkyl groups are those described above. Typically, the photosensitivity contributor will have at least one relatively bulky substituent such as isopropyl, t-butyl, n-hexyl, n-dodecyl, any of the branched and unbranched alkyl groups intermediate in C-number between the latter two alkyl groups, cyclohexyl, cyclopentyl, cycloheptyl, etc.

For example, the preferred copolysilane of this invention is one wherein both X and Y are methyl and wherein one of A and B is methyl and the other is cyclohexyl. It has a high photosensitivity to photodepolymerization and produces volatile fragments as discussed more in detail below. This polymer has a ratio of X/Y units to A/B units of 1/1. When the ratio of dimethyl units to methylcyclohexyl units is about ¼, the resulting copolymer has good photosensitivity, but, due to the increased fragment weight caused by the increased relative content of cyclohexyl groups, the copolymer does not ablate well at room temperature. Nevertheless, this copolysilane is useful within the scope of this invention, especially when higher polysilane temperatures are involved during the irradiation period. The complementary copolymer wherein the ratio of dimethyl units to cyclohexylmethyl units is 4/1 has lower photosensitivity but produces depolymerization products which are volatile at lower temperatures. In addition, because of the increased content of methyl groups, the polymer has an increased crystallinity which lowers the achievable resolution. Nevertheless, the polymer is valuable for many of the less demanding uses discussed herein.

The copolymer of dimethyl units and isopropylmethyl units or t-butylmethyl units is highly crystalline. However, these polymers can be used within the broad scope of this invention in view of their inherent photosensitivity and the volatility of the depolymerization fragments. Also highly crystalline are copolymers of ethyl/methyl units with dimethyl units and of methyl/n-propyl units with dimethyl units. These copolymers similarly can be employed within the broad scope of the uses of this invention. The copolymer of phenylmethyl units with dimethyl crosslinks under the influence of ultraviolet radiation making its use within the scope of this invention problematic.

As noted above, the range of suitable carbon atom content for the X/Y moieties of this invention can preferably be defined as a minimum of 2,3,4,5, or 6 or as having a maximum of 12,11,10,9,8 or 7. Similarly, A and B together can have a total preferred carbon atom content of 4,5,6 or 7 or a preferred maximum carbon atom content of 12,11,10,9 or 8.

The molar ratio of the X/Y units to the A/B units is not critical. In general, this ratio is limited at the upper end (increasing volatility-unit content) by the tendency toward crystallization contributed by the relatively smaller size of the X and Y moieties. Simlarly, as this ratio gets larger, the photosensitizing effect contributed by the A/B groups may become too small. At the lower end (increasing A/B content), the ratio is limited by a tendency of the depolymerization fragments to remain nonvolatile even at elevated temperatures. However, in most cases, a very broad range of suitable ratios will be useful and can be routinely selected for each polymer.

Similarly, the molecular weight of the polysilanes is also uncritical. Typically, the number of monomer units in a polymer varies from 3 to 20,000 or 50,000. All chain lengths will be photosensitive as long as sufficiently short wavelength actinic radiation is utilized, e.g., about 250 nm or shorter. Molecular weights up to 2,000,000 or more can be involved with no problems. In general, as the molecular weight increases, the maximum wavelength effective to cause photodepolymerization will also increase. Consequently, as the photodepolymerization process ensues, the maximum effective wavelength will decrease to shorter values, i.e., the ultraviolet energy necessary to continue the photodepolymerization process will increase. For this reason, actinic radiation well below the maximum effective wavelength at the beginning of a process will be employed. As mentioned, wavelengths less than about 250 nm will usually be effective for this purpose. Nevertheless, if desired, wavelengths throughout the ultraviolet range can be utilized in dependence upon the particular polymer employed in accordance with the foregoing.

Although U.V. radiation is preferred, actinic wavelengths in the visible range are also possible, as are higher energy radiations such as X-ray or gamma ray and charged particle beams, e.g., electron beams. A very wide variety of actinic radiation sources can be used, spanning a very broad range of low intensity devices to very high power, e.g., laser devices. The preferred mode uses laser irradiation, e.g., from a pulsed excimer laser, typically of an intensity of $1 \times 10^{-6}$ to 1 J/cm$^2$, higher or lower values being employable depending on whether local heating is desired and on other factors discussed herein or obvious to skilled workers. Of course, irradiation with high power sources has the advantage that polysilanes of relatively lower photochemical sensitivity can be employed. These are more easily handled than are the more reactive polysilanes.

In general, the polymers will be photodepolymerized at about room temperature. That is, actinic radiation intensities will be selected to cause photodepolymerization quickly without significantly thermally affecting the remaining polysilane. However, where desirable, e.g., in order to increase the volatility of photodepolymerization products, increased polysilane temperatures can be used during actinic irradiation. The polysilane temperature can be increased by simple, conventional heating of the substrate and/or the polysilane coating itself, e.g., by inductive, conductive or radiative means. It can also be increased by employing high energy, pulsed or continuous wave lasers or other high intensity sources which will raise the instantaneous local temperature of the polysilane molecules undergoing photodepolymerization.

The volatile products of the depolymerization reactions are environmentally benign. In vacuo, the fragments are simple low molecular weight silylenes such as dimethyl silylene and higher homologues, in dependence upon the precise structure of the recurring units, or are simple subunits of the polymeric chain, i.e., typically monomers, dimers, trimers, tetramers, etc. In air, the products are the corresponding oxidized fragments, e.g., the corresponding low molecular weight siloxanes. The siloxanes are physiologically innocuous and pose essentially no risk to personnel. Similarly, they are noncorrosive and pose essentially no risk to equipment as long as routine conventional safeguards are employed, e.g., adequate ventilation is provided. These are very important properties for the commercial utilizability of the polysilanes, e.g., in photofabrication processes.

Without intending to limit the scope of this invention in any way, it is believed that photodepolymerization of the polysilanes used in this invention occurs via chain scission at the silicon atoms having the most sterically hindered substituents. UV absorption occurs via electronic transitions in the silicon atoms. The resultant high energy excited state is unstable and results in depolymerization producing the fragments discussed above. The resultant depolymerized area (substrate) is essentially completely flat, there being essentially no observable traces of polymer fragments.

It has been discovered that this depolymerization process is a highly efficient one, e.g., a quantum yield of about 6 has been measured for the depolymerization of (cyclohexylmethyl Si/dimethyl Si)$_n$. This compares very favorably with quantum yields of 0.1 to 0.4 for commercial photoresists. The high yield for this invention suggests a free radical mechanism in the unzipping of the chain, most probably, it is theorized, via the intermediacy of diradicals. Furthermore, the fluorescence quantum yield for the same polymer is about 0.6, indicating that 40% or less of the impinging photons actually result in an effective depolymerization absorption. On this basis alone, quantum yields improved by a factor of about 2 will be achieved by using polymers having decreased fluorescence yields, a parameter which can be readily measured for any candidate polymer. A further increase in quantum yield can be achieved by increasing the temperature of the polysilane since diradical processes are generally observed to be strongly temperature activated. Overall, it can be seen that the photo-fabrication processes of this invention will proceed with heretofor unachievable efficiency.

The properties of the polysilanes used in this invention are excellent for the wide variety of photo-fabrication and other uses mentioned herein. As discussed, they have widely varying crytallinities in dependence upon the structure of the monomeric units incorporated. High crystallinity will be tolerable or even desired when attractive decorative effects are to be patterned in a substrate. For higher resolution imaging, of course, a very low or essentially zero crystallinity will be desired, e.g., typically causing less than about 20% scattering of incident visible radiation and preferably much less.

The polysilanes of this invention also have high stability properties, e.g., mechanically, chemically and thermally. The mechanical stability of the polymers is retained when the polymers are coated onto a wide variety of substrates, including quartz, glass, metals, e.g., silicon and other semiconductor substrates, ceramics, polymers, etc. The polysilanes adhere well to all such surfaces, without any special surface pretreatments. Mechanical stability as well as chemical stability is also retained after exposure to the common etchants employed in photofabrication processes, e.g., ferric chloride, stannous chloride, etc. The polymers have good thermal stability. For example, differential scanning calorimetry has revealed the cyclohexylmethyl-/dimethyl copolymer to be thermally stable to 390° C. Thermogravimetric methods have shown no weight loss for this polymer up to about 220° C., and some weight loss (about 10%) only at about 325° C. probably due to the presence of lower molecular weight chains (oligomers). Consequently, this polymer will be employable in high temperature processing. Similar results are observed for the other polysilanes, precise results being routinely determinable in each case.

Another important requirement for certain photofabrication processes, e.g., in the semiconductor industry, is a low content of trace metals, e.g., sodium cations derived from the preparative methods discussed below. Routine purification procedures and/or modifications of the preparative chemistry can readily achieve the necessarily low metal contamination concentrations, e.g., less than about 10 ppm or lower. Many other properties of the polysilane films of this invention are also excellent for the intended purposes.

Because of the wide variety of structural combinations available in the polysilanes of this invention, many of these properties can be fine tuned for an intended end use. This is especially the case for the polysilane copolymers, which provide at least two basic monomeric units for structural variation. The copolymers, of course, can comprise more than two basic units, i.e., the copolymer can comprise not only one volatility- contributing unit and one photosensitivity-contributing unit but also 3, 4 or more different recurring monomeric units. This provides a high tailorability of properties.

As mentioned above, this invention is also directed to the use of the polysilanes. All these polymers can be used for the conventional purpose of providing protective coatings on a wide variety of substrates. Such coatings can be conventionally prepared by incorporating a conventional crosslinking agent in effective amounts into the polysilane coating. Upon UV irradiation, a crosslinked protective coating will result. They also can be used conventionally as impregnating agents for strengthening ceramics, precursors for beta-SiC fibers, and as dopable semiconductors. See, e.g., J. Am. Chem. Soc., 103, 7352 (1981); J. Am. Ceram. Soc., 61, 504 (1978); and Chem. Lett., 551 (1976).

However, primarily, this invention is directed to the use of the polysilanes in photofabrication, e.g., in the application of positive image patterns onto substrate surfaces, that is as a new class of unique photoresists. The uniqueness is derived from the fact that upon exposure to a pattern of actinic radiation, the polysilanes depolymerize to directly expose the underlying surface in the same pattern. This eliminates the development step heretofor necessary in conventional photoresist technology.

In one use, the photoresists of this invention are applied to a substrate and then irradiated with actinic radiation to produce a decorative pattern. In such applications, crystallinity of the polysilane is often not a problem and can even be an advantage since unique decorative patterns can be produced by the scattering of light by the crystal centers. More preferably, the photoresists of this invention are used in low resolution imaging where integrity of an irradiated pattern is required but line widths are relatively large, e.g., on the order of many tens or hundreds of micrometers. In this application, crystallinity is also often not a problem.

Most preferably, this invention is directed to high resolution imaging using the photoresists of this invention. Here, resolution of a few microns is necessary (e.g., about 2–10 $\mu$m; VLSI applications) or even lower (ULSI applications).

For all the photofabrication techniques of this invention, the general method is to coat the desired substrate with a photoresist of this invention. The image of the desired pattern is then focused on the coating whereby those portions of the underlying coating on which the actinic radiation impinges are depolymerized, exposing the underlying surface. The exposed surface is then treated as desired, whereupon the remaining photoresist is removed by flooding the entire surface with actinic radiation causing the entire photoresist to ablate. As can be seen, this general method not only eliminates the heretofor necessary development step, but also replaces the previous chemical stripping of the remaining photoresist by the much simpler photolytic method. The stripping step can also be carried out using solvents if desired, e.g., those employable in the polymerization of the polysilanes (see below) or others in which the polymers are soluble (see e.g., Example 1 below).

The polymers of this invention can be coated onto any substrate using conventional means such as pouring, dipping, brushing, spreading, spraying, spin casting, etc. The polymers can be applied neat or dissolved in a compatible inert solvent such as THF, chlorinated hydrocarbons, toluene, xylene, hexane, etc. The coatings can be dried at room temperature over a period of hours, e.g., 3–4 hours, or can be heated or sprayed to set at shorter times. Storage of the polymers is not a problem unless long times are involved whereupon conventional means to protect them from actinic radiation can be taken, e.g., they can be stored in foil-covered or otherwise light blocking vials.

The polysilanes can be applied in any appropriate thickness, e.g., from about 1 $\mu$m to about 1 mil. The thickness will be chosen in accordance with the desired resolution, smaller thicknesses generally being employed when higher resolutions are desired. For example, for a resolution of about 1 $\mu$m, a thickness of about 1 $\mu$m will suffice. Thickness is controlled conventionally, e.g., by varying concentration, the number of layers are deposited, etc.

Unlike many photoresists, the photoresists of this invention are usually applied without the copresence of photosensitizers. However, of course, if desired, e.g., if it is desired to use a particular light source to which the polysilanes per se are not sensitive, conventional photosensitizers can be employed in conventional amounts.

Irradiation times will be very short, e.g, on the order of seconds or much shorter in dependence upon the intensity of the actinic radiation source and layer thickness. As mentioned, the nature of the source is not critical, low power (e.g., $10^{-6}$ J/cm$^2$ or lower) or high power (1 or more J/cm$^2$) devices being employable such as continuous wave or pulse lasers or lamps. The optics associated with the actinic radiation are fully conventional. Preferably, ultraviolet radiation is used, generally lower than 330 nm and preferably lower than 254 nm, e.g., using a KrF excimer laser at 248 nm.

A particularly preferred application of the photofabrication techniques of this invention is in the electronics industry in making printed circuit boards, computer chips, etc. However, the polysilanes may also be used for non silver-based photography since the quantum yields are so high. For example, in one method, a crosslinking agent will be included in the polysilane coating. Upon exposure to patterned actinic radiation, a photographic positive image will be preliminarily set in the coating. Thereafter, by appropriate heating of the remaining polymer containing the conventional crosslinking agent, the positive image will be finally set therein. In a related application, the polysilane films of this invention can be used as interlayer dielectrics, again by including in the layers conventional cross-linking agents. Upon exposure to patterned actinic radiation, the resultant positive image can be finally set in the dielectric layer by conventional heating of the remaining polymer. This eliminates the now required additional steps required to achieve such a positive image in a dielectric layer in state-of-the-art microelectronic devices.

The polysilanes of this invention are prepared by processes which are essentially conventional. These are generally described in many of the references cited above. In essence, the corresponding monomeric halosilanes (preferably the dichlorosilanes) are polymerized in the presence of an alkali metal catalyst, preferably sodium, in an inert solvent such as toluene, preferably at elevated temperatures, e.g., 90°–100° C. under reflux. The solvent has a minor effect on the resultant polymers via its influence on the nature of the end groups of the chains. It is desirable that the sodium be added to the reaction in a uniform manner. This results in a more homogeneous molecular weight distribution. The precise rate of sodium addition is not critical. Molecular weight can also be controlled by addition of small amounts of monohalosilanes as chain terminators. All of the polysilanes can be prepared analogously to the methods described in the following examples. Also see the following which report some of the preparations which are a part of this invention; J. Poly. Sci., Polym. Lett. Ed., 21, 819 (1983); ibid, 823; and J. Poly. Sci., Polym. Chem. Ed., 22, 159 (1984); ibid, 225. As disclosed in the following examples and in all of the references mentioned herein, conventional fractionation and other treatments are used to further purify the initially obtained polysilanes, e.g., to eliminate low molecular weight oligomers or cyclic materials and, as well, residual alkali metal cations.

The starting material silanes, preferably the corresponding dichlorosilanes are mostly commercially available either as stock items or as specialty chemicals. All can be routinely prepared by conventional Grignard addition to chlorosilanes. Silanes other than halosilanes can also be used and are commercially available or readily preparable from known starting materials.

In certain less preferred aspects, this invention can exclude the following subclasses of polysilanes per se but not their use in accordance with the preferred methods of this invention. In one subclass, there are excluded homopolymers wherein X/Y are methyl/p-tolyl; in another, copolymers wherein X/Y are beta-phenethyl/methyl and A/B are cyclohexyl/methyl or wherein X/Y are p-tolyl/methyl and A/B are cyclohexyl/methyl or wherein X/Y together form pentamethylene and A/B are cyclohexyl/methyl. In another, there are excluded homopolymers wherein X/Y are beta-phenethyl/methyl, or methyl/cyclohexyl, or methyl/phenyl, or methyl/n-hexyl or methyl/n-dodecyl or wherein X/Y together form pentamethylene. In yet another, there are excluded copolymers wherein X/Y are methyl/methyl and A/B are methyl/cyclohexyl, or wherein X/Y are methyl/methyl and A/B are methyl/n-hexyl.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

Synthesis, Purification, Characterization and Properties of (Cyclohexyl Methyl Si/Dimethyl Si)$_n$ Purified cyclohexylmethyldichlorosilane (48.9 g, 0.248 mole) and purified dimethyldichlorosilane (32.0 g, 0.248 mole) are added to 500 ml of dry toluene in an oven dried, N$_2$-purged, 3-necked flask equipped with reflux condenser, N$_2$ inlet, stirring bar, and pressure equalizing dropping funnel. The toluene solution of monomers is heated to reflux and a mineral oil dispersion of sodium metal (62.74 g of 40% by weight dispersion, 1.091 g-atom) is added cautiously from the dropping funnel at the most rapid and constant rate permitted by the highly exothermic reaction. Throughout the course of the synthesis and purification of the polymer, it is protected from light to prevent premature photodegradation. Reflux of the dark blue reaction mixture is continued for 4 hours after sodium addition is completed. Neat methanol is then added cautiously to the cooled reaction mixture until H$_2$ evolution from the destruction of excess Na stops. A volume of saturated aqueous sodium bicarbonate equal to the volume of the reaction mixture is added in a single portion and the resulting two-phase mixture stirred vigorously until the blue color is completely dissipated. After separation of the layers, the cloudy organic phase is filtered through filter aid to remove small amounts of insoluble polymer. Removal of the toluene solvent from the filtrate at reduced pressure affords a yellow-brown viscous oil. Crude high molecular weight (cyclohexyl methyl Si/dimethyl Si)$_n$ is precipitated from this oil by addition of ten volumes of ethyl acetate. Filtration gives a slightly tacky polymer which is purified by one precipitation from toluene with ethyl acetate and two precipitations from tetrahydrofuran with methanol. This procedure provides 5.56 g of pure white, flocculent (cyclohexyl methyl Si/dimethyl Si)$_n$. Gel permeation chromatography analysis of this material shows it to possess a trimodal molecular weight distribution (modes at 5000, 40000 and 300000 daltons). Spectral data consistent with the copolymer structure were obtained as follows: UV (nm): λmax 304 (ε6400), λmax 223(ε3100); $^1$HNMR (relative to tetramethylsilane reference): δ1.3 (br. s, Si-CH$_3$), 1.8 and 2.3 (br. m., Si-cyclohexyl); IR (cast film) (cm$^{-1}$): 2940, 2880, 1458, 1250, 833, 750, 728. The copolymer is soluble in chlorinated hydrocarbons, aromatic hydrocarbons, and tetrahydrofuran, moderately soluble in alkanes and cycloalkanes, and slightly soluble in ether, acetone, ethyl acetate, and isopropanol. It is essentially insoluble in water, methanol, and other highly polar organic solvents. Thermogravimetric analysis shows the material to suffer essentially no weight loss to 220° C., 10% at 325° C., and 50% loss at 380° C. Differential scanning calorimetry shows no detectable transitions (Tg or Tm) from −140° C. to the strong decomposition exotherm at about 390° C. Atomic absorption analysis indicated the above sample to contain 80 ppm Na by weight.

Elemental Analysis: C=53.78%; H=10.84%; Si=31.15%;

Theoretical Si content assuming a 1/1 molar ratio of cyclohexylmethyl units to dimethyl units is 35.31%.

All other polysilanes are preparable analogously.

EXAMPLE 2

Casting of Films of (Cyclohexyl Methyl Si/Dimethyl Si)$_n$

Depending on the thickness desired, a solution of the above copolymer in the 0.1–1% concentration (w/w) range in toluene is prepared and particulates removed by passing the solution through a 0.2 μm membrane filter. The solution is then applied to the substrate (e.g., glass, quartz, silicon, aluminum, copper) and allowed to evaporate slowly while protected from light. Alternatively, films can be prepared by spin casting. Films of submicron thicknesses up to 1 mil or more can be prepared by these methods and possess excellent adherence to all of the above substrates.

EXAMPLE 3

Patterning of (Cyclohexyl Methyl Si/Dimethyl Si)$_n$ Films

A 1 μm thick film of the above polymer on metallic silicon is patterned with pulsed ultraviolet light from a KrF excimer laser (2480 Å max, 10 Å full width at half height) and energy levels of $10^{-6}$ J/cm$^2$, using a quartz mask. Approximately a thousand 10 nanosecond pulses are sufficient to completely ablate a 1 μm film in the exposed area. The polymer films have also been patterned successfully with a low intensity hand-held low pressure Hg lamp (2537 Å) in less than 60 seconds.

EXAMPLE 4

Analogously to Example 1, homopolysilanes and copolysilanes having alkyl or aryl portions as described above but with substituents bonded thereto have been prepared, e.g., homopolysilanes of methyl/p-methoxyphenyl and others. Suitable substituents on the alkyl, cycloalkyl, alkylene or phenyl moieties include $C_{1-6}$-alkoxy, mono- or di-($CC_{1-3}$-alkyl)-amino, $C_{2-6}$-alkanoyl or the corresponding $C_{2-3}$-ketals, $C_{1-6}$-alkyl as mentioned above, $NH_2$, and OH, e.g., methoxy, ethoxy, etc., methylamino, ethylamino, etc., diethylamino, dimethylamino, etc., acetyl, propanoyl, etc., and the corresponding ethylene or propylene ketals, methyl, ethyl, etc., amino, hydroxy, etc. Generally, suitable alkyl portions of these substituents are those mentioned above in conjunction with the X, Y, A and B moieties. Also prepared were polymers having naphthyl groups attached to the Si-backbone, e.g., β-naphthyl/methyl homopolymer or 100 (phenyl/methyl)/1 β-naphthyl/methyl copolymer. α-naphthyl groups can also be used. The naphthyl groups can also be substituted as described. p-phenyl substitution is preferred. Usually, there is only one substituent per pendant group, but additional substitution is contemplated as an equivalent.

The analogous preparation of these substituted or naphthyl-containing polymers is varied simply by employing the corresponding substituted or naphthyl-containing starting material halosilanes which are all conventionally preparable and/or commercially available. In addition, where necessary or advisable, as will be readily recognized by skilled workers, groups such as alkanoyl can be conventionally protected during the polymerization, preferably with readily cleavable ketone protective groups. Amino and hydroxy groups can also be protected but this is usually not necessary.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A polysilane which is substantially free of low molecular weight oligomers or cyclic materials and whcih comprises recurring units of —Si(X)(Y)— wherein

X and Y together have 4–13 carbon atoms, and

X and Y each indepedently is hydrogen, alkyl, cycloalkyl, substituted phenyl, 1- or 2-naphthyl, or phenylalkyl, or together X and Y are an alkylene group forming a ring with the adjoining Si atom, wherein X and Y groups which are not H can optionally be substituted by one of $C_{1-6}$-alkoxy, mono- or di-($C_{1-3}$-alkyl)amino, $C_{2-6}$-alkanoyl or the corresponding $C_{2-3}$-ketal thereof, $C_{1-6}$-alkyl, —$NH_2$ or —OH; with the proviso that only one of X and Y can be substituted phenyl, and wherein, as a result of the selection of X and Y, said polysilane has sufficient photosensitivity to depolymerize upon exposure to actinic radiation, forming products which volatilize.

2. A polysilane of claim 1 which is substantially non-crystalline and wherein neither X nor Y is H.

3. A polysilane of claim 1 wherein one of X or Y is cyclohexyl and the other is methyl.

4. A polysilane of claim 1 wherein X and Y each is methyl, ethyl, phenethyl, isopropyl, n-propyl, t-butyl, n-hexyl, or dodecyl, or X and Y together form a pentamethylene group.

5. A polysilane of claim 2 which is substantially not cross-linked upon exposure to actinic UV radiation.

6. A polysilane copolymer comprising recurring units of —Si(X)(Y)—, and —Si(A)(B)—, Si(X)(Y) being different from Si(A)(B), wherein X and Y together have 1–13 carbon atoms, and X and Y each independently is hydrogen, alkyl, cycloalkyl, phenyl, alkylphenyl, or phenylalkyl, with the proviso that only one of X and Y contains a phenyl moiety, or together X and Y are an alkylene group forming a ring with the adjoining Si atom, and wherein A and B together have 3–13 carbon atoms, and A and B each independently is alkyl, 1- or 2-naphthyhl, or cycloalkyl, wherein X, Y, A and B groups which are not H can optionally be substituted by one of $C_{1-6}$-alkoxy, mono- or di-($C_{1-3}$-alkyl)amino, $C_{2-6}$-alkanoyl or the corresponding $C_{2-3}$-ketal thereof, $C_{1-6}$-alkyl, —$NH_2$ or —OH;

with the proviso (a) that when one of A and B is ethyl, the other is not methyl or ethyl, and (b) that when one of A and B is n-propyl and the other is methyl, X and Y are not both methyl.

7. A polysilane of claim 6 which is substantially non-crystalline and wherein neither X or Y is H or alkylphenyl.

8. A polysilane of claim 7 wherein the ratio of —Si(X)(Y)— to —Si(A)(B)— is about 1 to 1.

9. A polysilane of claim 6 wherein X and Y are both methyl and wherein one of A and B is methyl and the other is cyclohexyl.

10. A polysilane of claim 6 wherein one of X and Y is methyl and the other is n-propyl, and one of A and B is methyl and the other is isopropyl.

11. A polysilane of claim 6 wherein X and Y each is methyl, ethyl, or propyl, or X and Y together form pentamethylene; and wherein one of A and B is n-propyl, isopropyl, t-butyl, cyclohexyl, n-hexyl or n-dodecyl and the other is methyl or ethyl.

12. A polysilane of claim 6 wherein X and Y each is methyl, and one of A and B is cyclohexyl, n-hexyl or n-dodecyl; or wherein one of X and Y is methyl and the other is n-propyl, and one of A and B is methyl and the other is isopropyl.

13. A polysilane of claim 6 comprising at least three different recurring units obtained from —Si(X)(Y)— and —Si(A)(B)— and including at least one of each said units.

14. A polysilane of claim 6, which is substantially free of low molecular weight oligomers or cyclic materials and which comprises said recurring units, and wherein, as a result of the selection of A, B, X and Y, said polysilane has sufficient photosensitivity to depolymerize upon exposure to actinic radiation, forming products which volatilize.

15. A polysilane which is substantially free of low molecular weight oligomers or cyclic materials and which comprises recurring units of —Si(X)(Y)— wherein

X and Y together have 5–13 carbon atoms, and

X and Y each independently is hydrogen, alkyl, cycloalkyl, substituted phenyl, 1- or 2-naphthyl, or phenylalkyl, or together X and Y are an alkylene group forming a ring with the adjoining Si atom, wherein X and Y groups which are not H can optionally be substituted by one of $C_{1-6}$-alkoxy, mono- or di-($C_{1-3}$-alkyl)amino, $C_{2-6}$-alkanoyl or the corresponding $C_{2-3}$-ketal thereof, $C_{1-6}$-alkyl, —$NH_2$ or —OH;

with the proviso that only one of X and Y can be substituted phenyl, and wherein, as a result of the selection of X and Y, said polysilane has sufficient photosensitivity to depolymerize upon exposure to actinic radiation, forming products which volatilize.

16. A polysilane which is substantially free of low molecular weight oligomers or cyclic materials and which comprises recurring units of —Si(X)(Y)— wherein

X and Y together have 4–13 carbon atoms, and X and Y each independently is hydrogen, alkyl, cycloalkyl, 1- or 2-naphthyl, or phenylalkyl, or together X and Y are an alkylene group forming a ring with the adjoining Si atom, wherein X and Y groups which are not H can optionally be substituted by one of $C_{1-6}$-alkoxy, mono- or di-($C_{1-3}$-alkyl)amino, $C_{2-6}$-alkanoyl or the corresponding $C_{2-3}$-ketal thereof, $C_{1-6}$-alkyl, —$NH_2$ or —OH;

and wherein, as a result of the selection of X and Y, said polysilane has sufficient photosensitivity to depolymerize upon exposure to actinic radiation, forming products which volatilize.

17. A polysilane which is substantially free of low molecular weight oligomers or cyclic materials and which comprises recurring units of —Si(X)(Y)— wherein

X and Y together have 5–13 carbon atoms, and

X and Y each independently is hydrogen, alkyl, cycloalkyl, 1- or 2-naphthyl, or phenylalkyl, or together X and Y are an alkylene group forming a ring with the adjoining Si atom, wherein X and Y groups which are not H can optionally be substituted by one of $C_{1-6}$-alkoxy, mono- or di-($C_{1-3}$-alkyl)amino, $C_{2-6}$-alkanoyl or the corresponding $C_{2-3}$-ketal thereof, $C_{1-6}$-alkyl, —$NH_2$ or —OH;

and wherein, as a result of the selection of X and Y, said polysilane has sufficient photosensitivity to depolymerize upon exposure to actinic radiation, forming products which volatilize.

18. A polymer of claim 1, wherein X and Y together have 6–13 C-atoms.

* * * * *